(12) United States Patent
Nguyen et al.

(10) Patent No.: US 8,081,503 B1
(45) Date of Patent: Dec. 20, 2011

(54) VOLATILE MEMORY ELEMENTS WITH MINIMIZED AREA AND LEAKAGE CURRENT

(75) Inventors: Andy Nguyen, San Jose, CA (US); Ling Yu, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 350 days.

(21) Appl. No.: 12/395,598

(22) Filed: Feb. 27, 2009

(51) Int. Cl.
*G11C 11/00* (2006.01)

(52) U.S. Cl. ............... 365/154; 365/49.11; 365/156; 365/174; 365/189.16; 365/189.05; 365/189.11; 365/202; 365/230.06; 365/230.03; 365/230.08; 365/233.16; 365/233.17

(58) Field of Classification Search .......... 365/154, 365/49.11, 156, 174, 188, 189.16, 189.05, 365/189.11, 202, 230.06, 230.03, 230.08, 365/233.16, 233.17
See application file for complete search history.

(56) References Cited

U.S. PATENT DOCUMENTS

| | | | |
|---|---|---|---|
| 5,025,417 A | 6/1991 | Miyamoto | |
| 5,214,327 A | 5/1993 | Saeki | |
| 5,432,467 A | 7/1995 | Reddy | |
| 5,757,702 A | 5/1998 | Iwata | |
| 5,920,201 A | 7/1999 | Mehrotra | |
| 6,114,843 A | 9/2000 | Olah | |
| 6,995,584 B1 | 2/2006 | Nguyen | |
| 7,257,763 B1 * | 8/2007 | Srinivasan et al. | 714/764 |
| 7,277,351 B2 | 10/2007 | Liu | |
| 7,411,853 B2 | 8/2008 | Liu | |
| 7,430,148 B2 | 9/2008 | Liu | |
| 2007/0115713 A1 * | 5/2007 | Trossen et al. | 365/129 |
| 2008/0169836 A1 * | 7/2008 | Rahim et al. | 326/41 |

FOREIGN PATENT DOCUMENTS

JP 4060128733 A * 1/1994

OTHER PUBLICATIONS

Lin-Shih Lui et al. U.S. Appl. No. 12/057,343, filed Mar. 27, 2008.

* cited by examiner

*Primary Examiner* — Fernando Hidalgo
(74) *Attorney, Agent, or Firm* — Treyz Law Group; G. Victor Treyz; Jason Tsai

(57) ABSTRACT

Arrays of memory elements may have data lines and address lines. Each memory element may have five transistors. An address decoder may receive an undecoded address signal and may produce a corresponding decoded address signal. The decoded version of the address signal may be used in addressing the memory elements in the memory array. The memory array may be loaded with configuration data. Loaded memory elements may each provide a static output control signal that configures a programmable logic transistor in programmable logic. The memory elements may be powered with an elevated voltage during normal operation. Boosted address signals may be used when addressing the memory array. The address decoder may contain circuitry that is responsive to a clear control signal and an address output enable signal. The memory element array may be cleared by asserting the clear control signal and address output enable signal.

16 Claims, 14 Drawing Sheets

VOLATILE MEMORY ELEMENTS WITH MINIMIZED AREA AND LEAKAGE CURRENT

BACKGROUND

This invention relates to volatile memory elements, and more particularly, to volatile memory elements for integrated circuits such as programmable integrated circuits.

Integrated circuits often contain volatile memory elements. Typical volatile memory elements are based on cross-coupled inverters (latches) and are used to store data. Each memory element can store a single bit of data.

Volatile memory elements are often used to store configuration data in programmable logic devices. Programmable logic devices are a type of integrated circuit that can be customized in relatively small batches to implement a desired logic design. In a typical scenario, a programmable logic device manufacturer designs and manufactures uncustomized programmable logic device integrated circuits in advance. Later, a logic designer uses a logic design system to design a custom logic circuit. The logic design system uses information on the hardware capabilities of the manufacturer's programmable logic devices to help the designer implement the logic circuit using the resources available on a given programmable logic device.

The logic design system creates configuration data based on the logic designer's custom design. When the configuration data is loaded into the memory elements of one of the programmable logic devices, it programs the logic of that programmable logic device so that the programmable logic device implements the designer's logic circuit. The use of programmable logic devices can significantly reduce the amount of effort required to implement a desired integrated circuit design.

Conventional memory cells contain clear transistors. The clear transistors can be turned on to set the contents of the memory cells to a known value. For example, the clear transistor in each cell may be used to selectively connect a storage node in the cell to ground, thereby clearing the cell contents. Memory cells can be cleared in this way during power-up operations or as part of a reconfiguration operation.

As circuit complexity increases in modern integrated circuits, it is becoming increasingly desirable to reduce the amount of area consumed by circuit components. For example, as the number of memory cells on certain integrated circuits is increased, it is desirable to ensure that cell sizes are minimized so that the total area of the integrated circuit does not become too large. At the same time, care should be taken to avoid incurring unusually large amounts of leakage current loses, as these losses can lead to unfavorably large amounts of power consumption.

It would therefore be desirable to be able to provide an integrated circuit such as a programmable logic device integrated circuit with memory cells that are compact and that exhibit satisfactory leakage current performance.

SUMMARY

Memory elements may be provided for integrated circuits such as programmable logic device integrated circuits. The memory elements may each have only five transistors including an address transistor and four other transistors that are arranged in the form of two cross-coupled inverters that serve as a bistable memory element.

The memory elements may be arranged in an array having rows and columns. Address lines may be used to address each column of the array. Data lines may be used to convey data to and from each row of the array.

Address decoder and data shift register circuitry and other control circuitry may be used in controlling operations on the memory elements in the array. For example, the address decoder and data shift register circuitry may be used to load configuration data into the array and may be used to read configuration data from the array.

An array of memory elements that has been loaded with configuration data may be used to configure programmable logic transistors in corresponding programmable logic on an integrated circuit. Each programmable logic transistor may have a gate that receives a respective static output control signal from one of the memory elements in the array. The transistors are turned on an off based on the configuration data loaded in the memory elements.

The memory elements in the array may be addressed using address decoder circuitry. The address transistor of each memory element may have its gate connected to a respective one of the address lines. The address decoder circuitry may receive an undecoded address signal and may produce a corresponding decoded address signal. The decoded version of the address signal may be used in addressing the memory elements in the memory array.

The memory elements may be powered with an elevated voltage during normal operation. Boosted address signals may be used to ensure proper data loading during configuration operations.

The address decoder circuitry may contain logic that is responsive to a clear control signal and an address output enable signal. When the clear control signal and address output enable signal are asserted, the memory element array may be cleared by driving logic one values from the data shift register portion of the control circuitry into the memory elements.

Further features of the invention, its nature and various advantages will be more apparent from the accompanying drawings and the following detailed description of the preferred embodiments.

DETAILED DESCRIPTION

The present invention relates to integrated circuit memory elements. The memory elements, which are sometimes referred to as cells, typically each contains five transistors, although arrangements with different numbers of transistors may be used if desired. The voltage levels that are used in powering the memory elements may be fixed or may be modulated as a function of time. The data signals that are associated with reading and writing memory cell data (i.e., the data bits on memory array bit lines) may have fixed or time-varying strengths. The voltage levels that are associated with address lines for the memory elements may also be provided using either fixed-strength or time-varying strength arrangements.

The memory elements may exhibit desirable attributes such as low leakage current and compact size. These attributes may make the memory elements suitable for use in a variety of integrated circuits. These integrated circuits may be, for example, memory chips, digital signal processing circuits with memory arrays, microprocessors, application specific integrated circuits with memory arrays, programmable integrated circuits such as programmable logic device integrated circuits in which memory is used for configuration memory, or any other suitable integrated circuit. Arrays of memory elements are generally described herein in the context of programmable integrated circuits such as programmable logic device integrated circuits. This is, however, merely illustrative. The memory cells may be used in any suitable circuits.

On integrated circuits such as memory chips or other circuits in which memory is needed to store processing data, the memory elements perform the functions of static random-access memory (RAM) cells and are sometimes referred to as SRAM cells. In the context of programmable logic device integrated circuits, the memory elements can be used to store configuration data and are therefore sometimes referred to as configuration random-access memory (CRAM) cells.

Random-access memory cells that are used in storing configuration data tend to have different requirements than random-access memory cells that are used in storing data for supporting data that is used in processing operations. SRAM arrays typically must support rapid read and write functionality to be used effectively. In CRAM applications, the speed associated with configuration data reading and writing operations is less critical, because these operations are preformed relatively infrequently. In the context of CRAM implementations, it is particularly desirable for the memory cells to exhibit good leakage current properties and compact sizes. These characteristics help to reduce circuit power consumption and help to reduce the amount of circuit area that is consumed by memory devices. Area reductions from compact cell arrangements may also help to improve reliability and manufacturing yield.

Figure 1:
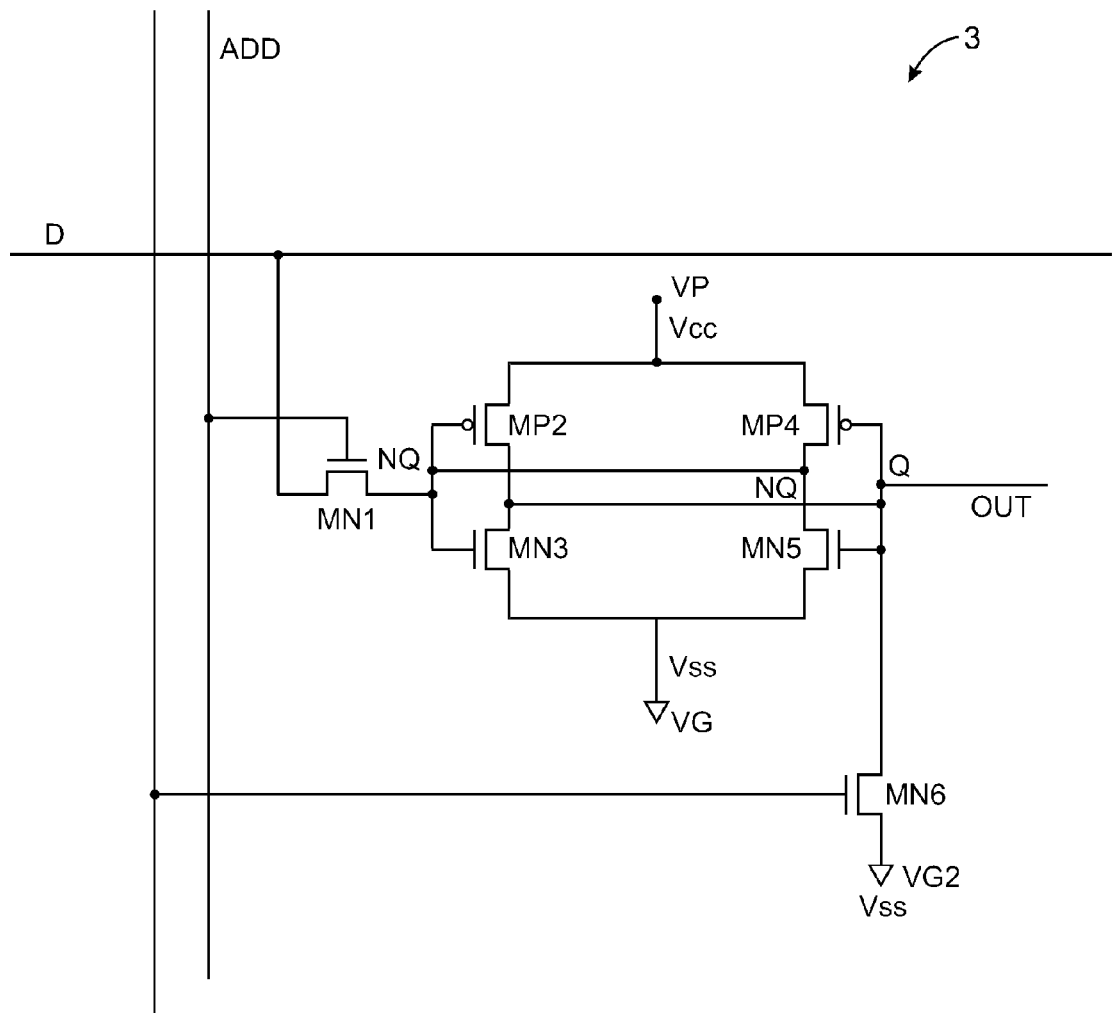
FIG. 1 is a circuit diagram of a conventional programmable memory element on a programmable logic device integrated circuit.

A conventional programmable logic device configuration random-access memory cell is shown in FIG. 1. Memory cell 3 of FIG. 1 contains six metal-oxide-semiconductor (MOS) transistors. Transistors MP2 and MN3 form a first inverter. Transistors MP4 and MN5 form a second inverter. The first and second inverters are cross-coupled in that the input of the first inverter (node NQ) is coupled to the output of the second inverter, whereas the input of the second inverter (node Q) is connected to the output of the first inverter. The first and second inverters are powered by positive power supply voltage Vcc (e.g., 1.2 volts) on positive power supply terminal VP and ground voltage Vss (e.g., 0 volts) on ground power supply terminal VG. The cross-coupled inverters of cell 3 serve as a bistable element that can be placed in one of two states.

Node Q may serve as an output that supplies output signal OUT. During normal operation of the programmable logic device that contains an array of cells such as cell 3, each cell is loaded with configuration data. The state of node Q in each cell represents the state of the loaded configuration bit for each cell. For example, if a given cell has a Q value of Vcc (i.e., a logic high or "1"), the signal OUT will be high and the configuration data bit for that cell will typically be referred to as a "1." If the value of Q for a cell is Vss, that cell will typically be referred to as containing a logic zero or "0." Cell 3 can be placed in a first mode in which Q is high or a second mode in which Q is low (i.e., cell 3 is bistable).

The signal OUT from each cell is applied to programmable logic components on the programmable logic device that contains the memory cells. Typically each OUT signal is applied to the gate of at least one associated metal-oxide-semiconductor transistor.

Conventional programmable memory elements such as memory element 3 of FIG. 1 are provided in large arrays on programmable logic device integrated circuits. To load configuration data into the proper memory elements, each memory element must be individually addressable. With the arrangement of FIG. 1, each memory element has an associated address transistor MN1. As shown in FIG. 1, each transistor MN1 has its gate connected to a respective address line to receive an associated address signal ADD. Each transistor MN1 also has its source and drain terminals (sometimes collectively referred to as source-drain terminals) coupled between a corresponding data line and node NQ.

When it is desired to load a configuration data bit into programmable memory element 3, signal ADD is asserted to turn on address transistor MN1. When MN1 is turned on in this way, the data D on the data line is driven into memory element 3. The data D represents the complement of the desired configuration data bit values for memory element 3. For example, when loading a "1" into memory element 3 to make node Q go high, it is necessary to drive a D value of "0" onto complementary node NQ. When data signal D on node NQ is taken low to "0," a logic "1" is stored on node Q and output signal OUT will be high.

In scenarios in which it is desired to drive a "0" into memory element 3 during array clearing operations, it is necessary to drive a Vss value of "0" onto node Q of memory element 3 via pass gate MN6. When reset signal R is taken high to "1," a logic "0" is stored on node Q and output signal OUT will be low.

After an array of programmable memory elements 3 on the programmable logic device has been loaded, it is generally desirable to confirm that the data has been properly loaded by reading out the loaded data. During read operations, the actual stored data values can be compared to expected configuration data values. If the data has been properly loaded, the device can be used normally. If an error has occurred during data loading, corrective action may be taken. For example, the correct data values can be reloaded into the array. Address signal ADD may be used to turn on address transistor MN1 during data read operations in the same way that address signal ADD is used to turn on address transistor MN1 during data write operations.

Following successful loading of the programmable memory elements in the array, the memory elements will supply output signals OUT to corresponding programmable logic resources to configure the logic resources to perform a desired custom logic function.

During power-up operations and operations in which memory elements are reprogrammed with fresh configuration data, it is desirable to clear the memory elements. When clearing a block of memory elements, clear control signal R is taken high, turning on clear transistor MN6. This pulls node Q of memory element 3 to ground voltage Vss at ground node VG2. When signal R is taken low at the completion of clearing operations, the state of memory cell 3 will be cleared (i.e., Q will be low and output signal OUT will be "0.).

The inclusion of clear transistors MN6 in the programmable memory elements of conventional programmable logic devices ensures that the memory arrays in these devices can be cleared when desired, but can lead to undesirable amounts of leakage current because non-negligible amounts of leakage current (also sometimes referred to as Ioff) can pass through transistor MN6 even when clear control signal R is deasserted. The inclusion of transistor MN6 in the memory element also adds size to the memory element. Large memory elements are generally undesirable, because they limit the number of memory elements that can be included in a given array and because they can adversely affect manufacturing yield and reliability.

Figure 2:
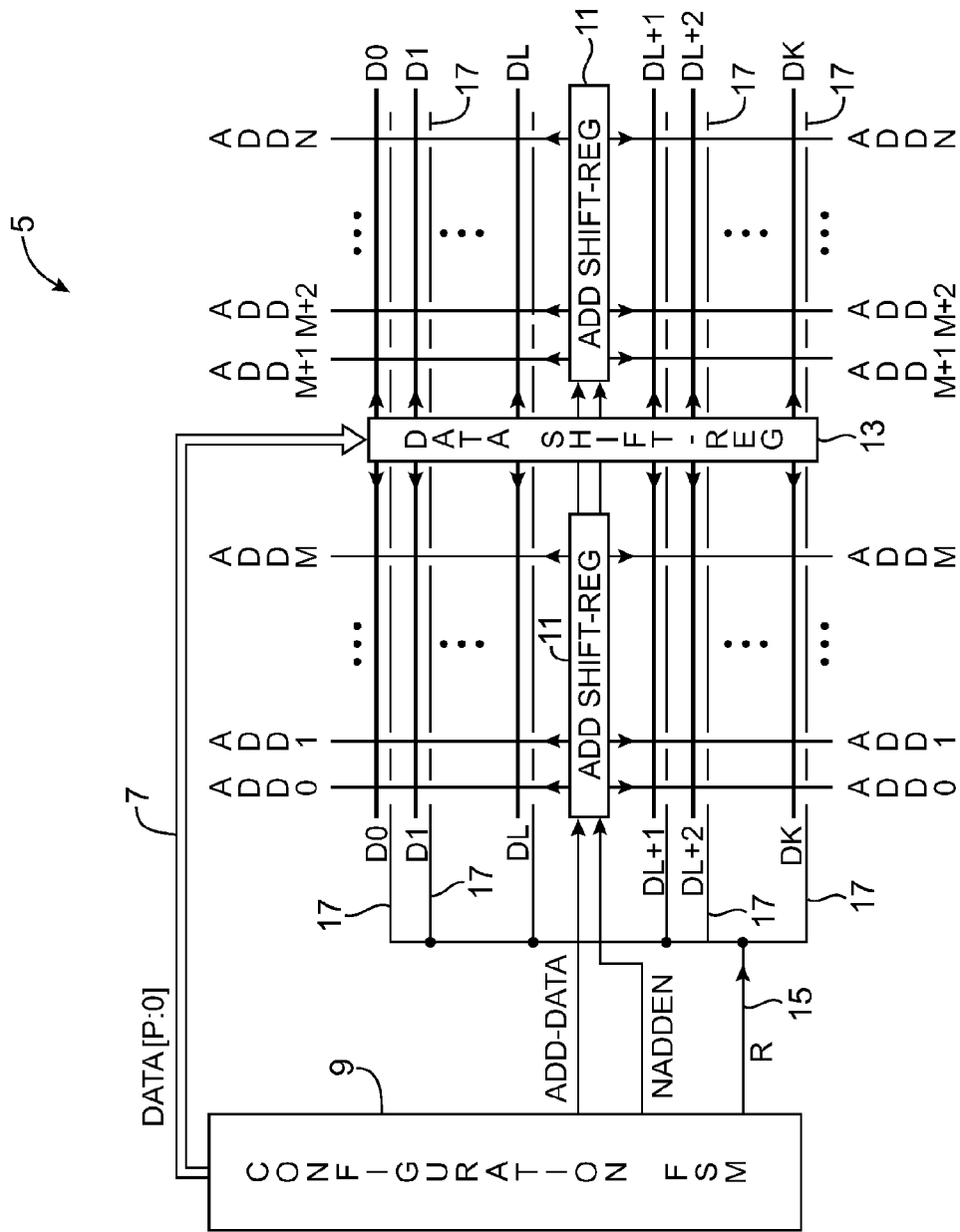
FIG. 2 is a circuit diagram of a conventional array of programmable memory elements and associated circuitry for controlling the memory element array in a programmable logic device integrated circuit.

Arrays of conventional memory elements such as programmable memory element 3 of FIG. 1 also require numerous clear control lines to convey clear control signal R to each of the programmable memory element clear transistors in parallel. A conventional array of programmable memory elements such as conventional memory element 3 of FIG. 1 is shown in FIG. 2. As shown in FIG. 2, array 5 includes multiple address lines, each of which carries a respective address signal ADD0 . . . ADDN. For example, the first address line carries address signal ADD0, the second address line carries address signal ADD1, etc. Each address line in array 5 is associated with a respective column of memory elements 3 (not shown in FIG. 2). Each row of array 5 has an associated data line D0 . . . DK. For example, the first row of array 5 has a data line that carries data signal D0. In the FIG. 2 example, there are N+1 columns of memory elements and K+1 rows of memory elements. Conventional programmable logic device memory element arrays typically include thousands of rows and columns.

Data is loaded into array 5 using data shift registers 13. Control logic on the programmable logic device is used to implement a control circuit that controls operations associated with loading configuration data into array 5 and reading loaded configuration data from array 5. This control circuit takes the form of a finite state machine such as configuration finite state machine 9 in FIG. 2. Configuration finite state machine 9 may produce control signals such as undecoded address signals ADD-DATA, address enable signal NADDEN, and clear control signal R on its outputs. Data path 7 may be used by configuration finite state machine 9 to provide configuration data to data shift registers 13 during data loading operations. Data from data shift registers 13 is conveyed to the memory elements over corresponding data lines, as shown by data signals D0 . . . DK in FIG. 2.

The configuration data from data shift registers 13 is loaded into corresponding programmable memory elements by systematically asserting appropriate address signals on the address lines. Address shift registers 11 are used to provide decoded address signals (signals ADD0 . . . ADDN) to the address lines in array 5 in response to undecoded versions of these address signals provided by configuration finite state machine 9. These undecoded address signals are depicted as address data signals ADD-DATA in FIG. 2.

Address enable signal NADDEN is used to control the application of decoded address signals ADD0 . . . ADDN to array 5. When NADDEN is low, decoded address signals ADD0 . . . ADDN are applied to array 5. When the decoded address signals are valid, there will generally be one address line that is high while all other address lines are low. The identity of the address line that is high depends on the state of the undecoded binary address ADD-DATA. To prevent glitches when configuration finite state machine 9 is transitioning between different ADD-DATA values, NADDEN may be taken high during address data transitions. NADDEN may also be held high (deasserted) during clear operations (i.e., when taking signal R high), so that all decoded address signals ADD0 . . . ADDN are low and none of the address transistors in array 5 are on when turning on the clear transistors MN6.

Array 5 has a network of clear lines 17 that provide clear control signal R from configuration finite state machine 9 to each of the memory elements in array 5 in parallel. In each memory element, the clear control signal R is applied to the gate of an associated clear transistor (transistor MN6 of programmable memory element 3 of FIG. 1). When clear control signal R is asserted, node Q in each of the memory elements is pulled to ground and a logic zero is loaded (i.e., the memory elements are all cleared in parallel). Clear operations may be performed in response to a power-on-reset signal or a reconfiguration control signal.

Figure 3:
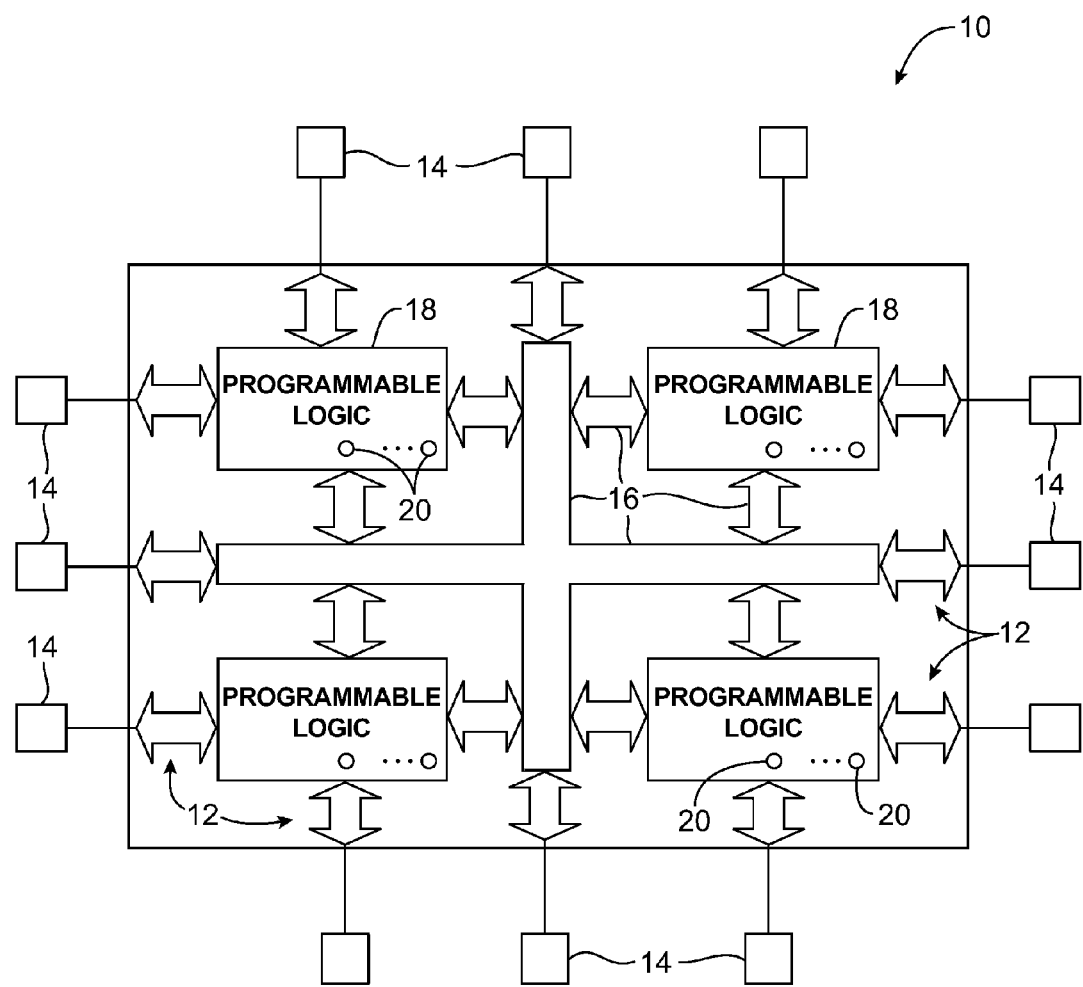
FIG. 3 is a circuit diagram of an illustrative integrated circuit such as a programmable logic device or other programmable circuit that may contain an array of programmable memory elements in accordance with an embodiment of the present invention.

In accordance with embodiments of the present invention, integrated circuits may be provided with memory elements that do not have clear transistors. The memory elements may exhibit minimized leakage current and area consumption characteristics. An integrated circuit such as a programmable logic device or other programmable integrated circuit 10 of the type that may include programmable elements in accordance with embodiments of the present invention is shown in FIG. 3.

Device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Device 10 contains volatile programmable memory elements 20 that can be loaded with configuration data (also called programming data) using pins 14 and input/output circuitry 12. Once loaded, the memory elements each provide a corresponding static control output signal that controls the state of an associated logic component in programmable logic 18. If desired, memory elements 20 may be used in SRAM-type memory arrays (e.g., to store data for processing circuitry during operation of device 10).

Each memory element 20 may be formed from a number of transistors configured to form a bistable circuit. With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a design for a typical modern programmable logic device, it may be desirable to include millions of memory elements 20 on each chip (e.g., in an array having thousands of rows and thousands of columns of memory elements). During programming operations, the array of memory elements can be provided with a user's configuration data. Once loaded with configuration data, the memory elements 20 selectively control portions of the circuitry in the programmable logic 18 and thereby customize its functions so that it will implement the user's desired custom logic design and will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

When memory elements 20 are arranged in an array, horizontal and vertical conductors and associated control circuitry may be used to load the memory elements with configuration data. Any suitable memory array architecture may be used for memory elements 20. One suitable arrangement in which memory elements 20 are arranged in memory element array 28 is shown in FIG. 4.

Figure 4:
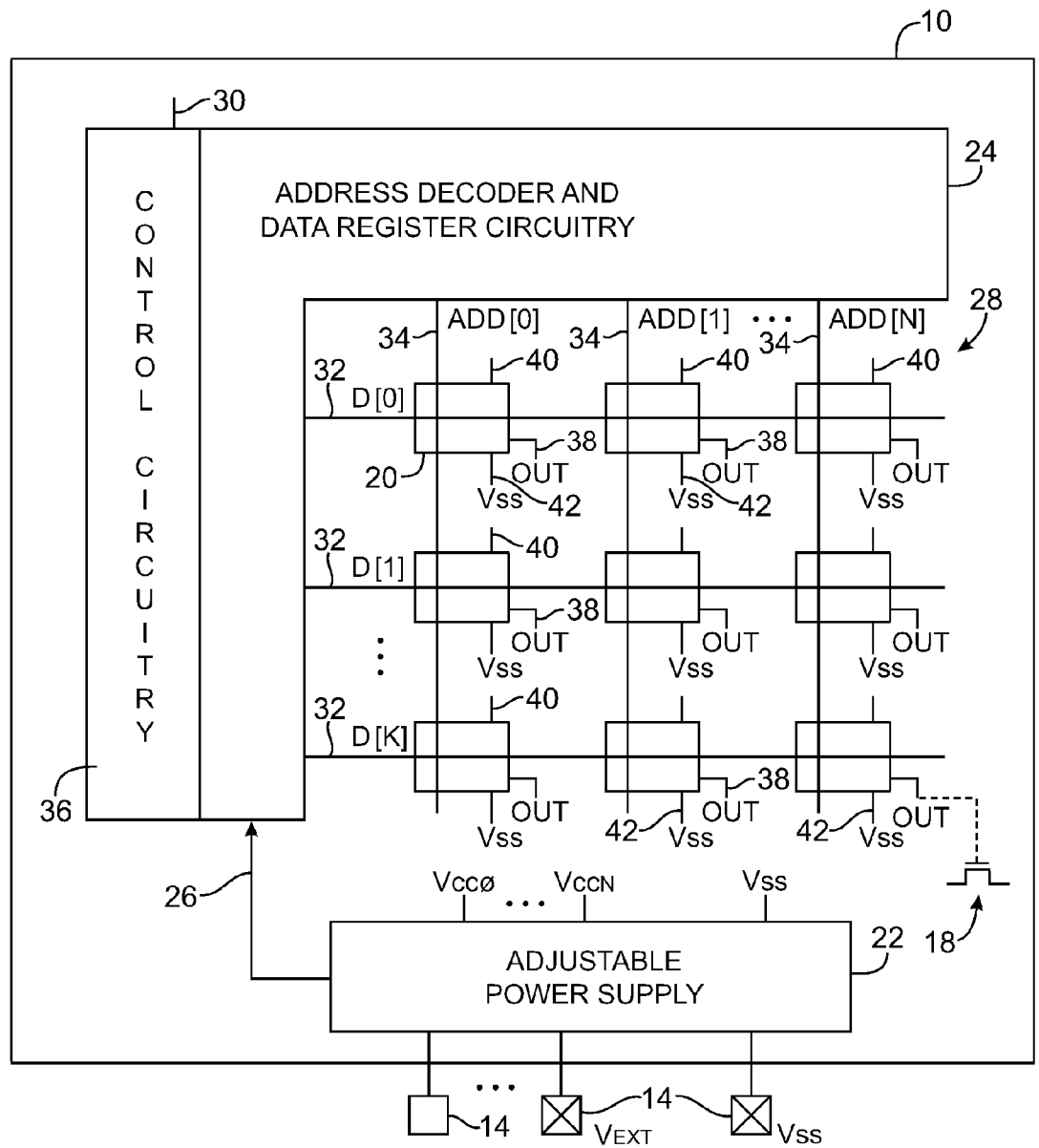
FIG. 4 is a circuit diagram of an illustrative array of memory elements and circuitry for controlling operations in the memory element array such as clearing the array, reading data from the array, and loading data into the array in accordance with an embodiment of the present invention.

As shown in FIG. 4, integrated circuit 10 may include control circuitry such as address decoder and data register circuitry, adjustable power supply circuitry (shown schematically as adjustable power supply circuitry 22), and control circuitry 36. Power regulator circuitry 22 may receive external voltages via pins 14. For example, power regulator circuitry may receive one or more positive power supply voltages such as Vext (e.g., Vcc and voltages above and below Vcc) and a ground voltage Vss (e.g., 0 volts). Examples of positive power supply voltages that may be received include a 0.9 volt positive power supply voltage, a 1.2 volt positive power supply voltage, a 2.5 volt positive power supply voltage, etc.

Adjustable power supply circuit 22 may produce internal power supply voltages on its outputs in response to control signals from control circuitry 36. The power supply voltages produced by circuitry 22 may include positive power supply voltages Vcc0 . . . Vccn, one or more ground power supply voltages such as ground power supply voltage Vss (e.g., 0 volts), and other suitable voltages. One or more of these voltages may be provided to address decoder and data register circuitry 24 via paths such as path 26.

Address decoder and data register circuitry 24 may serve as control circuitry for controlling operations on array 28 such as data write operations (i.e., data loading), data read operations, and memory array clear operations. Additional control circuitry that is associated with address decoder and data register circuitry may be used in implementing a finite state machine or other suitable control circuit. In the diagram of FIG. 4, additional associated control circuitry is shown as control circuitry 36.

In a typical scenario, control circuitry 36 can be used in implementing a finite state machine that controls array 28. Because the finite state machine is used in operations associated with loading configuration data into array 28 to configure array 28 and its associated programmable logic, the finite state machine may sometimes be referred to as a configuration finite state machine (configuration FSM).

The control circuitry of FIG. 4 may be used to read and write data from memory cell array 28. When array 28 is being used as regular SRAM, data write operations may be performed to store processing results and data read operations may be performed to retrieve stored data. When array 28 is being used as CRAM, data write operations may be performed to load configuration data and data read operations may be performed to confirm that configuration data loading operations have been performed successfully. Clear operations may be performed upon power-up or at other suitable times such as at the beginning of a reconfiguration operation.

Array 28 may include numerous rows and columns of memory cells 20. In the FIG. 4 example, there are N+1 columns and K+1 rows of memory elements 20 in array 28. This is merely illustrative. Integrated circuits such as integrated circuit 10 may have any suitable number of memory elements 20. A typical memory array might, as an example, have thousands, millions (e.g., hundreds of millions), or more memory elements 20 arranged in hundreds or thousands of rows and columns.

Power regulator circuitry 22, control circuitry 36, and address decoder and register circuitry 24 may be used as control circuitry to generate signals for array 28. Signals may be fixed in magnitude or may have time varying magnitudes.

Consider, as an example, memory elements that are powered with a positive power supply voltage Vcc. In this type of array 28, it may be desirable to decrease Vcc during data writing operations. This can help make it easier to drive data into memory elements 20. After data writing operations are complete, the power supply voltage Vcc can be restored to its nominal level. As an alternative or in conjunction with this type of technique, the power supply voltage Vcc may be elevated relative to the nominal programmable logic power supply voltage during normal operation. If, for example, the nominal positive power supply voltage on device 10 is a Vcc voltage of 0.9 volts, memory elements 20 may be powered at an elevated voltage Vcch of 1.2 volts during normal operation. With this type of arrangement, the static output voltage associated with each programmed cell that contains a "1" may be elevated (e.g., at 1.2 volts instead of 0.9 volts). This elevated static control signal may be helpful in fully turning on transistors such as n-channel metal-oxide-semiconductor transistors in programmable logic 18 that are controlled by the static output control signals produced by the programmable memory elements.

Similarly, the voltages associated with other signals may use either a fixed magnitude arrangement or a time-varying magnitude arrangement. In fixed-magnitude schemes, signals may, for example, vary between Vss and Vcc. In a time-varying arrangement, signals may sometimes range between Vss and Vcc and may, at other times, range between Vss and Vcch (i.e., the magnitude of the signals may be set to Vcc during certain periods of time and Vcch during other periods of time). Certain signals may also always be provided with elevated magnitudes.

Signals that have elevated magnitudes are sometimes referred to as overdriven signals. Signal overdrive arrangements may be used to help turn on transistors more fully than would otherwise be possible and may therefore help to improve performance. For example, overdriven address transistors may be used to help improve write margin and/or read margin. Overdriven data signals (e.g., elevated values of D on the data lines in array 28) may be used to help improve write margin (as an example). The versions of the data signals that are read from array 28 may be provided by the memory elements at overdriven voltage levels by elevating the power supply voltage for one or both of the cross-coupled inverters in the memory element during read operations. Any suitable combination of these types of arrangements may be used if desired.

Signal magnitude variations can be imposed on both logic high signals (e.g., by temporarily reducing a logic high value from 0.9 volts to 0.7 volts) and logic low signals (e.g., by temporarily changing a logic low value from 0 volts to −0.2 volts). Combinations of positive voltage variations and ground voltage variations may also be made to implement real-time signal magnitude adjustments if desired.

Circuitry 36 may be used in controlling clearing and data loading operations for array 28. Circuitry 36 may, if desired, be used in implementing a finite state machine. The finite state machine may be used in configuring array 28 and may therefore sometimes be referred to as a configuration finite state machine (configuration FSM).

Circuitry 36 may receive signals using a path such as path 30. For example, circuitry 36 may receive data such as configuration data from external sources via path 30. In a typical programmable logic device system, configuration data is loaded into a programmable logic device from a memory and data loading circuit. This type of circuit, which is sometimes referred to as a configuration device, loads configuration data into registers within circuitry 24. Data can also be generated by control circuitry 36.

Address decoder circuits in circuitry 24 may receive external control signals or addressing control signals can be generated internally in circuitry 24. Address signals are labeled ADD[0] . . . ADD[N] in FIG. 4 because there are N+1 address lines 34 and corresponding address signals in the FIG. 4 example. The address signals on lines 34 are typically controlled independently in each column.

Unlike the conventional circuitry of FIG. 2, array 28 of FIG. 4 does not have clear lines 15 that receive clear control signal R. The programmable elements in array 28 also need not include any clear transistors. Nevertheless, array 28 can be cleared by proper control of address decoder and data register circuitry 24 and associated signal values in array 28. Clear operations may be performed during power-up operations or later, as part of a reconfiguration operation in which it is desired to load fresh configuration data into array 28. Some or all of array 28 can be cleared. For example, certain subsets of programmable memory elements 20 in array 28 can be cleared.

Configuration data may be loaded into registers in circuitry 24 of FIG. 4 in series. These registers may then apply the configuration data in parallel to array 28 via data lines 32. The data signals are labeled D[0] . . . D[K], because there are K+1 rows of memory elements in the example of FIG. 4.

Address decoder circuitry in circuitry 24 may receive undecoded address data via path 30 and the configuration finite state machine implemented using control circuitry 36. The address decoder circuitry can then systematically assert desired address lines 34. As the address line in each column is asserted (i.e., as the signal ADD[i] in a given column is taken high), the data on the data lines 32 is loaded into the memory elements 20 in that column. By addressing each column in this way, the entire array 28 may be loaded with configuration data. Memory elements 20 may be powered using one or more positive power supply voltages applied to terminals such as positive power supply terminals 40 and a ground power supply voltage applied to ground terminals 42.

After array 28 has been loaded, the output 38 of each memory element 20 produces a corresponding static control signal for controlling the gate of a pass transistor or other logic component in the programmable logic 18 of the programmable logic device 10 (FIG. 3). Data reading operations may be performed by systematically asserting desired address lines 34 and monitoring the resulting data on data lines 32 (e.g., using sense amplifier circuitry in circuitry 24).

Figure 5:
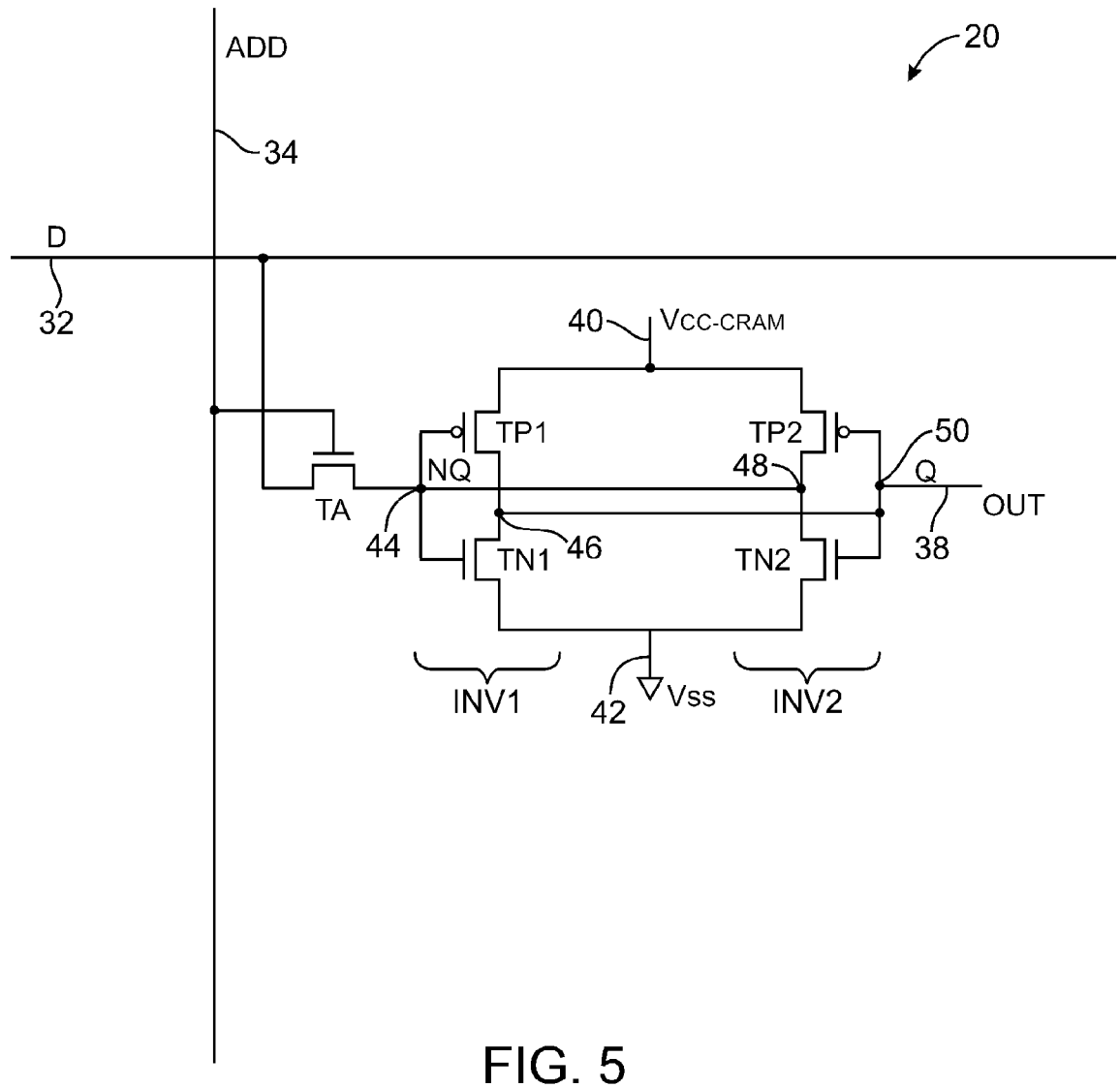
FIG. 5 is a circuit diagram of a programmable memory element that may be used in a programmable integrated circuit or other integrated circuit in accordance with an embodiment of the present invention.

A memory element 20 of the type that may be used in array 28 of FIG. 4 is shown in FIG. 5. As shown in FIG. 5, memory element 20 may have p-channel metal-oxide-semiconductor (PMOS) transistors TP1 and TP2 and n-channel metal-oxide-semiconductor (NMOS) transistors TA, TN1, and TN2. Data signals D (i.e., one of D[0] . . . D[K] in FIG. 4) can be conveyed over data line 32. Address signal ADD (i.e., one of ADD[0] . . . ADD[N] in FIG. 4) may be used to control address transistor TA. Ground terminal 42 Vss may be powered using a ground voltage Vss of 0 volts or other suitable ground voltage.

Adjustable power supply circuitry 22 of FIG. 4 may supply memory element 20 with a positive power supply voltage Vcc-cram. Positive power supply voltage Vcc-cram may have any suitable value. With one suitable arrangement, Vcc-cram may be fixed at a single positive voltage level of 0.9 volts (i.e., a voltage equal in value to the voltage used in powering logic components in most or all of programmable logic 18 (FIG. 3). With another suitable arrangement, Vcc-cram may vary as a function of time under control of control circuitry such as circuitry 36 of FIG. 4 and other control circuitry (e.g., between a low value of 0.9 volts and an elevated value of 1.2 volts). Elevated voltage levels may, for example, be used for Vcc-cram after data has been loaded into memory array 28 to ensure that the magnitude of output signals OUT for cells that have been loaded with logic "1" values is large enough to fully turn on NMOS transistors in logic 18 whose gates are being controlled by output signals OUT. With another suitable arrangement, there may be more than one positive power supply voltage for programmable memory element 20 and these voltages may have different values, may both be time-varying, may both be fixed, etc. There may also be multiple ground voltages of these types for memory elements 20.

Transistors TP1 and TN1 form a first inverter (inverter INV1). Transistors TP2 and TN2 form a second inverter (inverter INV2). Inverters INV1 and INV2 are cross-coupled in that the output of inverter INV1 (node 46) is connected to the input of inverter INV2 (node 50), whereas the output of inverter INV2 (node 48) is connected to the input of inverter INV1 (node 44). Cross-coupled inverters INV1 and INV2 form a bistable memory element for programmable memory cell 20.

When a configuration data bit is stored in memory element 20, node 44 has a value equal to the inverse of the stored data bit (complementary data signal NQ). The value of the stored data bit (true data signal Q) is stored on node 50. Node 50 is coupled to output line 38, so output signal OUT is equal to data value Q.

Address transistor TA is used to access cell 20. The gate of address transistor TA is connected to address line 34. The source-drain terminals of address transistor TA are connected in series between data line 32 and node 44. When signal D is 1 and address signal ADD is asserted, transistor TA turns on and drives signal NQ high. When signal NQ is driven high, signal Q at node 50 is driven low by the output of inverter INV1. A signal D of 1 can therefore be used to place a "0" into cell 20. Similarly, a low value of D may be used to place a "1" into cell 20 when address transistor TA is turned on by asserting address signal ADD.

It may be desirable to use a layout for address shift-register and data shift register circuitry 24 (FIG. 4) that places blocks of circuitry 24 in the center of array 28. An illustrative arrangement that may be used for control circuitry in memory array 28 of FIG. 4 when controlling memory elements 20 of the type shown in FIG. 5 is shown in FIG. 6.

Figure 6:
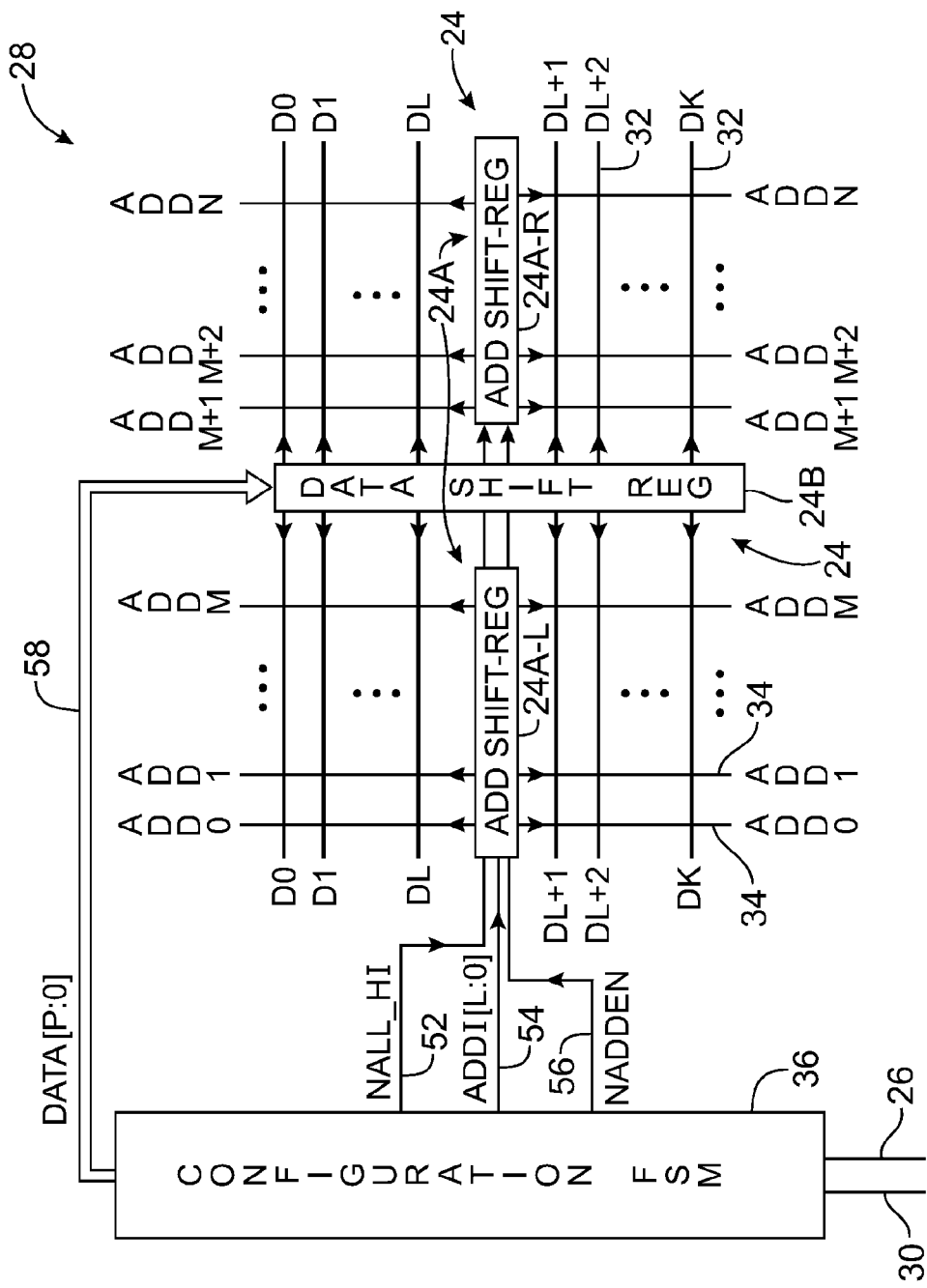
FIG. 6 is a circuit diagram of an illustrative array of memory elements and associated circuitry showing how control circuitry may be used to implement a configuration finite state machine that is used in conjunction with address shift register circuitry and data shift register circuitry in controlling the array in accordance with an embodiment of the present invention.

As shown in FIG. 6, address decoder and data register circuitry 24 (FIG. 4) may be implemented using a column of data shift register circuitry 24B and a row of address shift register circuitry such as address shift register circuit 24A-L and address shift register circuit 24A-R. These circuit components may be located in a central location within the cells of array 28 to help evenly distribute signal load and distribution delays and thereby improve device performance.

Data signals D may be provided to data shift register 24B from configuration finite state machine 36 using data path 58. Configuration finite state machine 36 may be used to generate control signals for circuitry 24 such as clear control signal NALL-HI on line 52, undecoded binary address signal ADDI [L:0] on path 54, and address enable signal NADDEN on path 56. Undecoded address signal ADDI[L:0] may specify which address line 34 is to be asserted when addressing array 28.

Address shift register circuits 24A-L and 24A-R serve as address decoders and provide a decoded address on lines 34 that corresponds to the undecoded address signal presented on address path 54. Address enable signal NADDEN may be deasserted when it is desired to temporarily prevent the decoded version of the address signal from being applied to address lines 34 to prevent glitches. Address enable signal NADDEN may be asserted when it is desired to allow the decoded address signal to be routed to lines 34.

When a valid undecoded address signal is presented to address path 54, there will generally be only one corresponding address signal that is taken high on lines 34. Array 28 is shielded from exposure to glitch-producing scenarios in which more than one address line 34 is driven high simultaneously by asserting the NADDEN signal during transitions between different input values for the undecoded address ADDI[L:0].

All address lines 34 may be taken high simultaneously during clear operations by asserting the signal NALL-HI. Enable signal NADDEN may be used as a gating control signal to precisely time the clear event while signal NALL-HI is being asserted by configuration finite state machine logic 36.

Any suitable control logic circuitry may be used for address decoder and data register circuitry 24 that is responsive to control signals such as NALL-HI, ADDI, and NADDEN. An illustrative circuit configuration for implementing address shift register circuitry 24A such as address shift register 24A-L for the left side of array 28 and address shift register 24A-R for the right side of array 28 is shown in FIG. 7.

Figure 7:
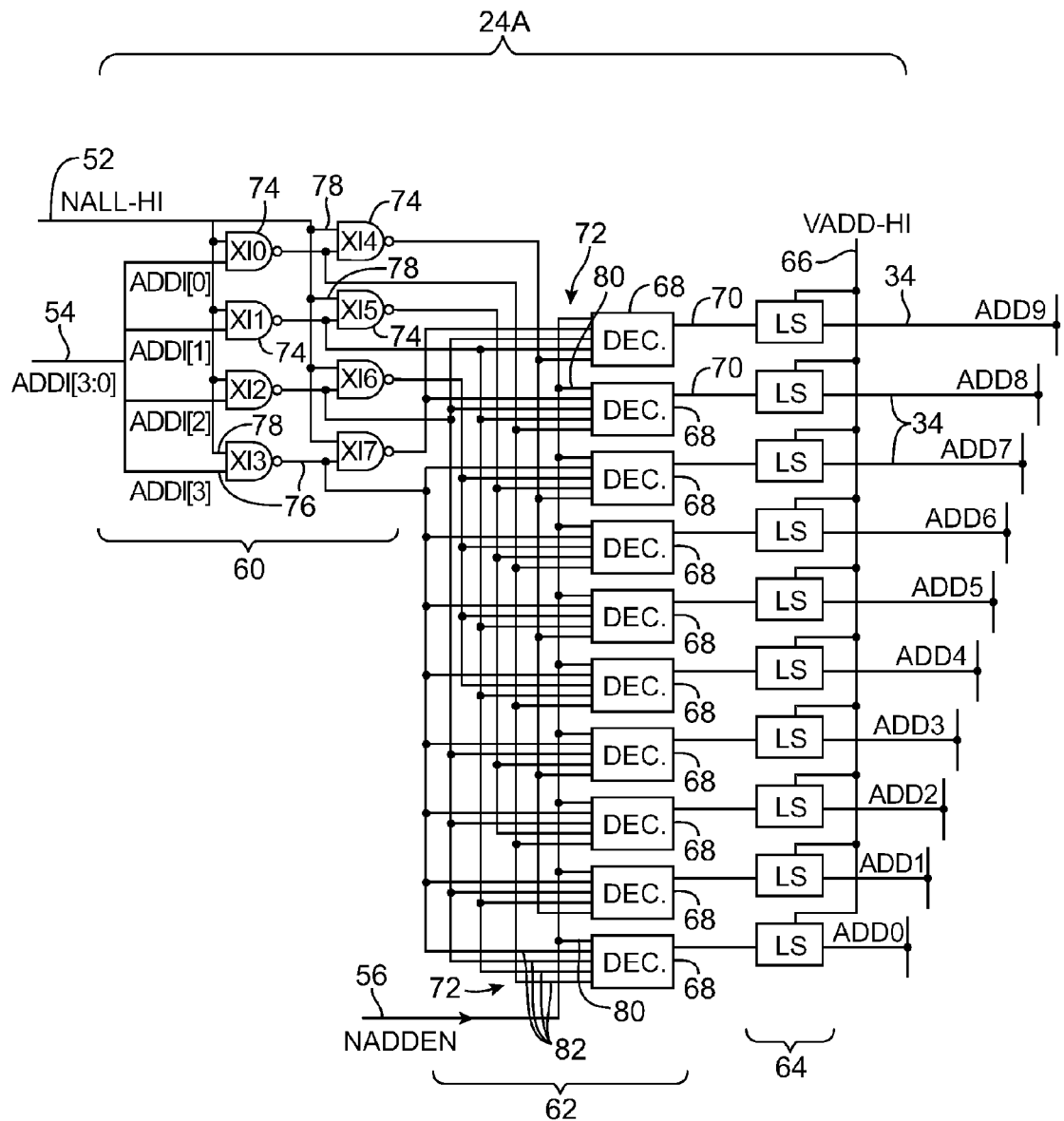
FIG. 7 is a circuit diagram of illustrative address decoding circuitry that may be used for the address shift register circuitry of FIG. 6 in accordance with an embodiment of the present invention.

As shown in FIG. 7, address decoder 24A may have an address decoder input stage 60, an address decoder output stage 62, and a level shifter stage 64. Address decoder 24A may receive undecoded address signals ADDI on input path 54 in binary. Corresponding decoded address signals ADD are provided at the output of address decoder 24A on address lines 34. In the example of FIG. 7, a four-bit undecoded address signal ADDI is presented on input 54, and is decoded to produce ten decoded address signals ADD on address lines 34. This is, however, merely illustrative. Address decoders such as address decoder 24A may be provided for memory cell arrays of any suitable size by scaling.

Signal NADDEN is provided to decoder output stage 62 and serves as an address output enable signal. When NADDEN is deasserted (e.g., by taking NADDEN high), the signals on all lines 34 at the output of decoder output stage 62 are held low (disabled). When lines 34 are disabled in this way, array 28 is shielded from conditions in which more than one address line 34 is accidentally taken high at the same time that might arise when transitioning between different values of undecoded address signal ADDI on input 54. Signal NADDEN may asserted when it is desired to allow address signals ADD to have non-zero values.

Signal NALL-HI is provided to input 52 of address decoder input stage 60 and serves as a clear control signal. When signal NALL-HI is asserted (e.g., by taking NALL-HI low), all of the address signals ADD on lines 34 can be taken high simultaneously. Data register 24B (FIG. 6) can be loaded with logic ones prior to clear operations. When NALL-HI and NADDEN are asserted, the ones will be driven onto complementary nodes NQ (nodes such as node 44 of memory cell 20 in FIG. 5), thereby loading "0" values into all cells 20 and clearing array 28.

Decoder input stage 60 may be formed from logic gates such as NAND gates 74. In this type of arrangement, each NAND gate may have multiple inputs and an output. One of the inputs (input 78) to each NAND gate 74 may receive the NALL-HI signal from path 52. The other of the inputs (input 76) is used to process address information received directly or indirectly from path 54. The outputs of decoder input stage 60 may be routed to the inputs 72 of decoder output stage 62.

Decoder output stage 62 may be formed from decoder circuits 68. Each decoder circuit 68 may be connected to a different pattern of the output lines from decoder input stage 60 and may produce a correspondingly different decoded address line signal on its output. For example, the lowermost decoder circuit 68 may produce decoded address signal ADD0, the next-to-lowermost decoder circuit 68 may produce address signal ADD1, etc.

Decoder output stage 62 may receive address output enable signal NADDEN from input 56. Each decoder circuit 68 may have an address output enable input 80 that receives address output enable signal NADDEN and a set of address inputs 82 that receive intermediate (partially decoded) address signals from the output of address decoder input stage 60. In the example of FIG. 7, each decoder circuit 68 has five inputs 72 including an NADDEN input and four intermediate address signal inputs 82. In address decoder circuits of other sizes, each decoder circuit 68 may have a correspondingly scaled number of inputs 82. If desired, clear control signal NALL-HI may be coupled to address decoder 24 using other logic gates (e.g., gates that are not necessarily associated with input stage 60). An advantage of feeding signal NALL-HI to stage 60 is that this arrangement may reduce the amount of logic and routing resources used to implement the clear control (all outs high) functionality.

The decoded address signals that are provided on outputs 70 of address decoder output stage 62 may be increased in strength by level-shifting circuitry 64. In the FIG. 7 example, circuitry 64 includes a number of level shifters LS. Each level shifter LS may be powered by an elevated power supply voltage such as VADD-HI received on path 66 (e.g., 1.2 volts or other suitable voltage that is elevated with respect to the nominal power supply voltage for programmable logic 18 such as 0.9 volts). There may be a level shifter LS for each output stage output line 70 and each corresponding address line 34. The output of each level shifter produces a level-shifted version of the decoded address signal.

Figure 8:
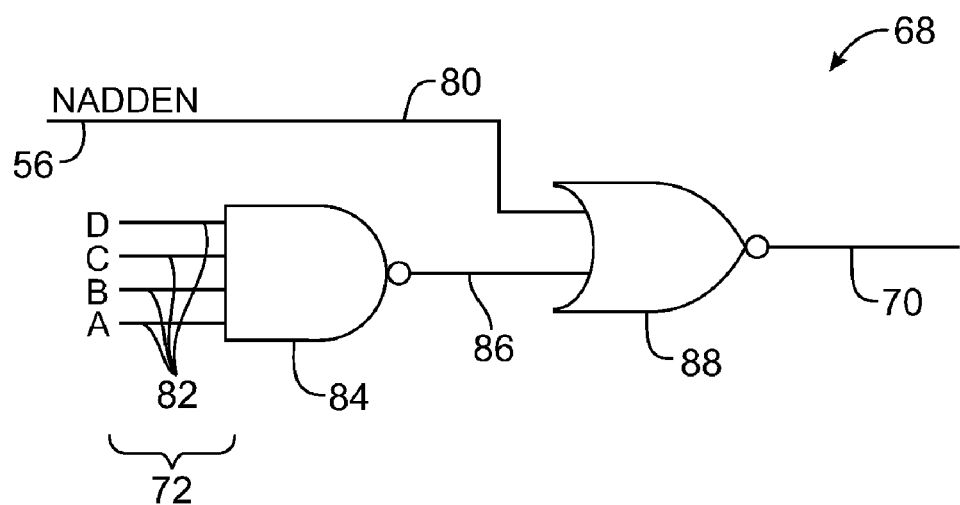
FIG. 8 is a circuit diagram of an illustrative address decoder block that may be used in an address decoder output stage portion of the address decoding circuitry of FIG. 7 in accordance with an embodiment of the present invention.

An illustrative decoder circuit that may be used for each decoder circuit 68 of FIG. 7 is shown in FIG. 8. In the FIG. 8 example, decoder circuit 68 includes NAND gate 84 and NOR gate 88. Input signals are received at inputs 72 and a decoded address signal is provided at output 70. Inputs 72 include NADDEN input line 80, which receives address output enable signal NADDEN from path 56 and four intermediate address signal inputs 82 (A, B, C, and D). NAND gate 84 produces an output signal that is conveyed to one of the two inputs of NOR gate 88 via path 86. The other input to NOR gate 88 is coupled to path 80 and receives the address output enable signal NADDEN. As shown by the circuit of FIG. 8, when NADDEN is high (deasserted), the output on line 70 will be low (i.e., the address signal ADD will be prevented from reaching lines 34, because all address lines 34 will be held low).

Figure 9:
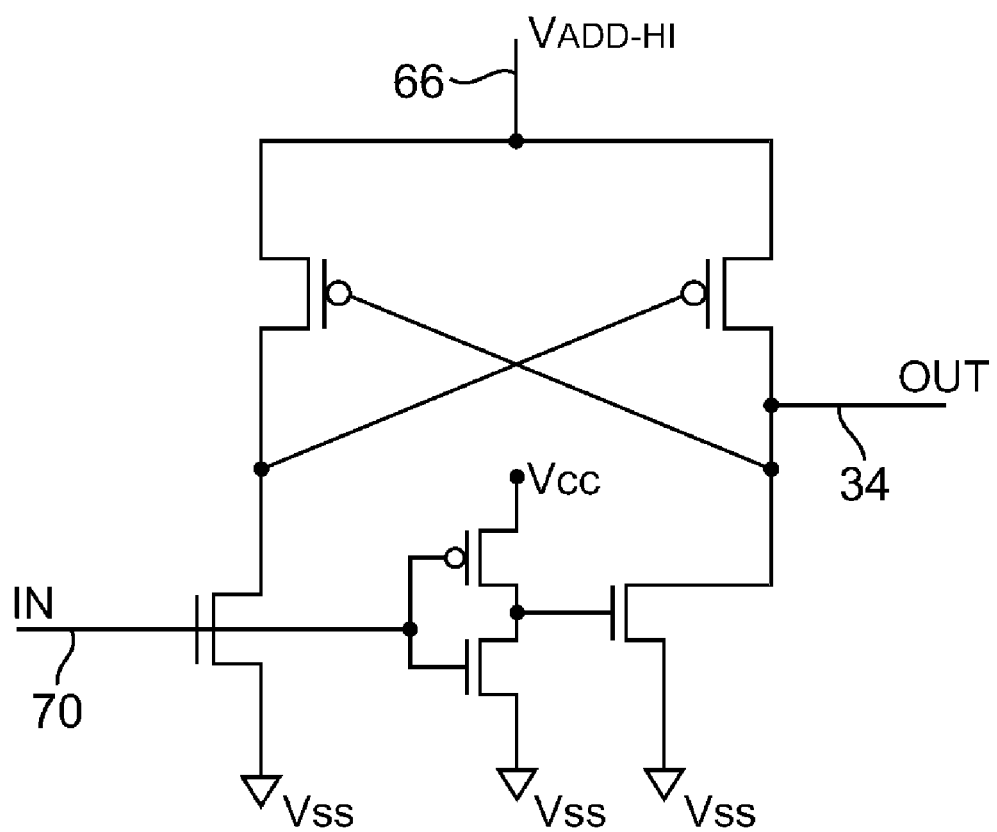
FIG. 9 is a circuit diagram of an illustrative level shifter circuit that may be used in address decoding circuitry of the type shown in FIG. 7 in accordance with an embodiment of the present invention.

FIG. 9 is an illustrative level shifting circuit LS of the type that may be used in the level shifters LS of level shifting circuit 64 (FIG. 7). Unboosted decoded address signals may be received on input 70 from the output of address decoder output stage 62. Corresponding level-shifted versions of these signals may be provided on output line 34. The input signals on line 70 may, for example, range from 0 volts to 0.9 volts (Vss to Vcc), whereas the output signals on line 34 may, for example, range from 0 volts to 1.2 volts (Vss to VADD-HI). Other amounts of boosting may be used if desired. Moreover, level shifting is optional. An advantage of overdriving the address signals using a level shifter of the type shown in FIG. 9 is that this helps to fully turn on the address transistors TA that are connected to line 34, ensuring that there is negligible loss in voltage (minimal threshold voltage losses) as data signals D traverse the address transistors when traveling between data lines 32 and nodes NQ in programmable elements 20.

Figure 10:
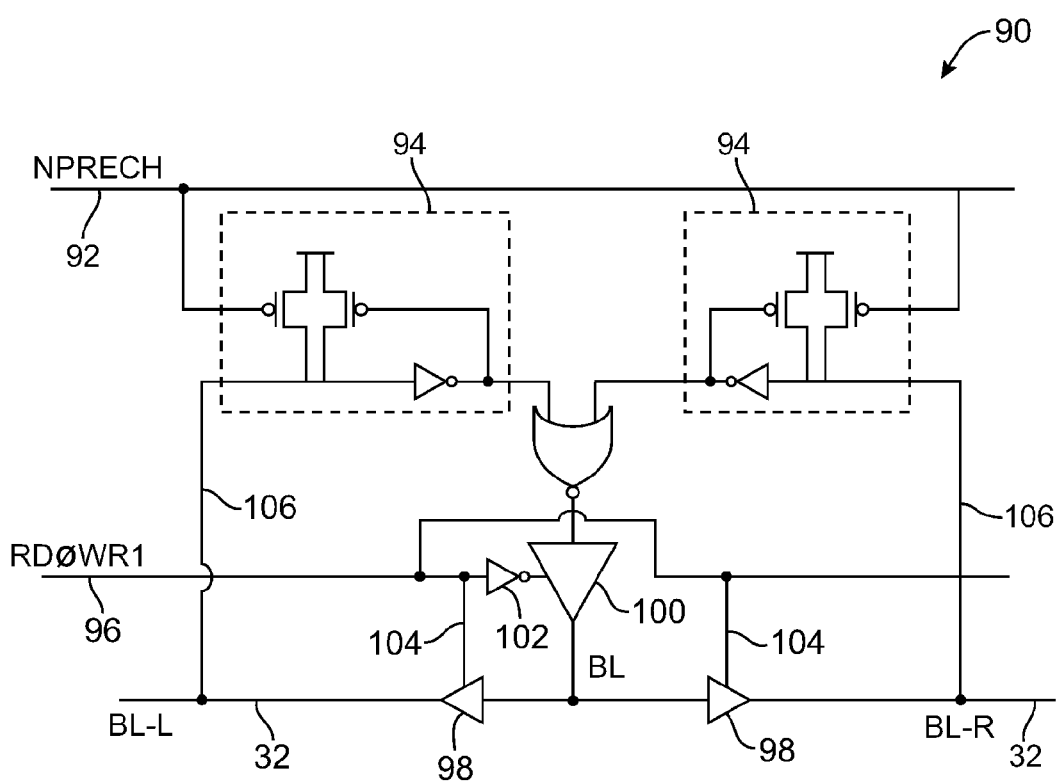
FIG. 10 is a circuit diagram of an illustrative data register circuit that may be used in data shift register circuitry of the type shown in FIG. 7 in accordance with an embodiment of the present invention.

FIG. 10 shows an illustrative data register circuit 90 of the type that may be used in data shift register 24B. During loading, circuit 90 may drive data signals BL-L and BL-R onto data lines 32 (e.g., respective data lines on the left and right of data shift register 24B in the orientation of FIG. 6). The signals BL-R and BL-L have the same value as signal BL when tristate drivers 98 are enabled.

In circuit 90, precharge control signal NPRECH is used to control precharge circuits 94. Read-write enable signal RD0WR1 is used as a tristate control signal. Signal RD0WR1 is routed to the control inputs of tristate drivers 98 via paths 104 and is routed (in complementary form) to the control input of tristate driver 100 by inverter 102. When RD0WR1 is low, driver 100 is enabled and drivers 98 are tristated. With drivers 98 tristated, precharge circuits 94 can use lines 106 to precharge data lines 32 in preparation for read operations on array 28 in response to precharge control signals NPRECH. When RD0WR1 is high, driver 100 is tristated (disabled) and drivers 98 are enabled. In this situation, data BL may be driven in parallel onto data lines (as shown by signals BL-L and BL-R in FIG. 10). There may be a driver circuit for each data line 32 in array 28. Only the data shift register circuitry that is associated with a single array row is shown in FIG. 10.

Figure 11:
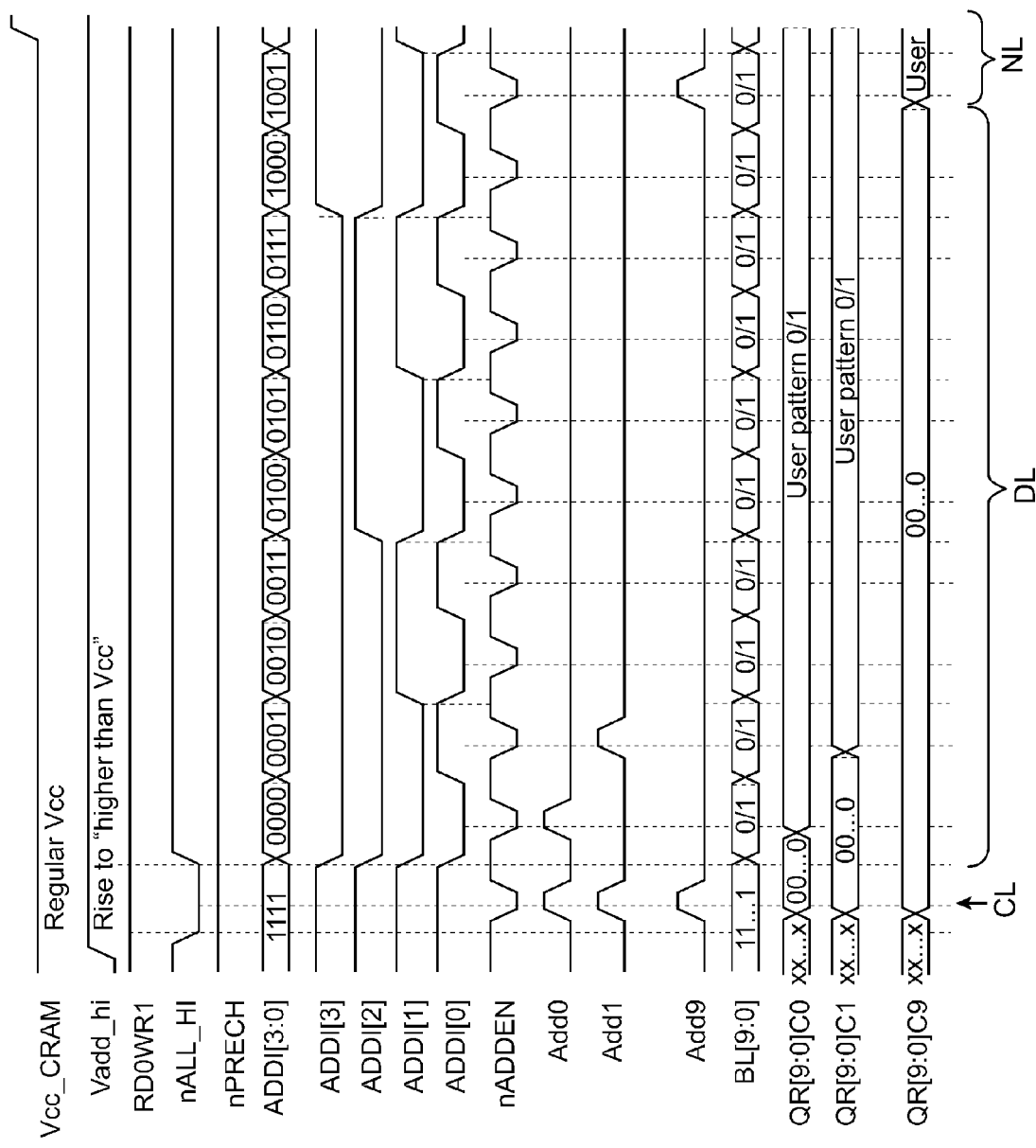
FIG. 11 is a timing diagram showing illustrative signal values during operations on an array of memory elements of the type shown in FIG. 5 when controlled using circuitry of the type shown in FIGS. 4 and 6 in accordance with an embodiment of the present invention.

A timing diagram that illustrates the operation of array 28 during clear operations CL, data loading operations DL, and normal operation NL is shown in FIG. 11.

In preparation for clearing and other operations, address line VADD-HI may be elevated to a value greater than Vcc before clearing operations CL, as indicated in the second trace of FIG. 11. Vcc-cram may be maintained at Vcc. In this scenario, address signals are larger than the cell power supply voltage, which overdrives transistors TA and thereby facilitates addressing operations (preventing excessive voltage drops as signals traverse address transistors TA).

During clear operations CL, clear control signal NALL-HI is taken low (asserted), which directs the address decoder to take all address signals ADD high. DATA signals D are all held high. When address output enable signal NADDEN is asserted (taken low), the high address signals ADD are applied simultaneously to the address transistors TA of all memory elements 20 in parallel. This turns all of the address transistors TA on and drives the high signals on data lines 32 into the nodes NQ of the memory cells. When nodes NQ are driven high in this way, nodes Q (right-hand nodes QR in the FIG. 11 example) are cleared to logic zero values. This clears array 28.

During data loading operations DL, control logic (configuration finite state machine 36) systematically presents address shift register 24A with different undecoded address signals (e.g., the control logic steps through all addresses systematically). As each undecoded address signal is presented, a corresponding one of address lines 34 is taken high, loading data from data lines 32 into a column of array 28. Address output enable signal NADDEN may be deasserted during transitions between undecoded addresses to prevent glitches that might otherwise arise (i.e., during transitional situations in which more than one address line is taken high simultaneously).

After data loading operations are complete, the power supply voltage Vcc-cram that is applied to power supply terminal 40 of each programmable memory element 20 (FIG. 5) can be elevated. This ensures that the output signals OUT from each memory element 20 will be sufficiently strong to turn on an NMOS transistor or other programmable logic component in logic 18 that is receiving the static output control signal OUT from that memory element during normal operations NL.

Figure 12:
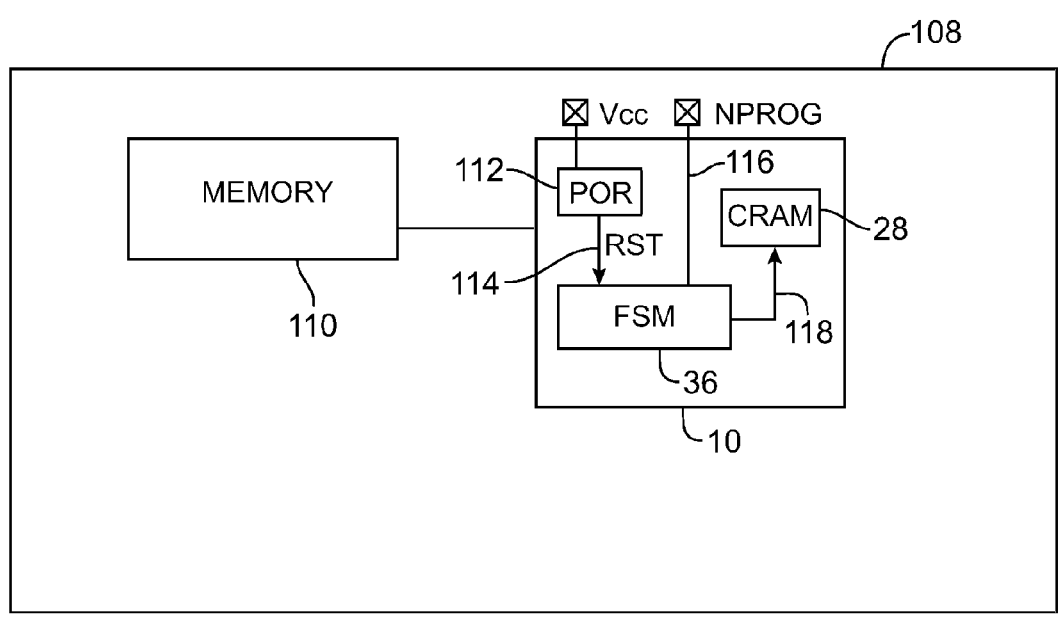
FIG. 12 is a diagram showing how control circuitry implementing a finite state machine can be controlled by power-on-reset signals and reconfiguration control signals to clear an array of memory cells of the type shown in FIG. 5 in accordance with an embodiment of the present invention.

As shown in FIG. 12, integrated circuit 10 may receive configuration data from an integrated circuit with memory 110 on printed circuit board 108 (as an example). Configuration finite state machine 36 may provide this data to memory array 28 via path 118. Before configuring memory array 28 in this way, configuration finite state machine 36 may clear array 28, as described in connection with FIG. 11. Clear operations may be performed upon power-up or later, in preparation for a reconfiguration operation. Integrated circuit 10 may have a power-on-reset circuit 112 that receives power supply signals such as Vcc from external pins. When the power supply voltage becomes valid by exceeding a given minimum threshold voltage, clear control signal RST on path 114 may be asserted. In response, finite state machine 36 may clear array 28. Finite state machine 36 may also clear array 28 when a reprogramming control signal such as signal NPROG is asserted on path 116 (e.g., when this signal is received from an external pin).

Figure 13:
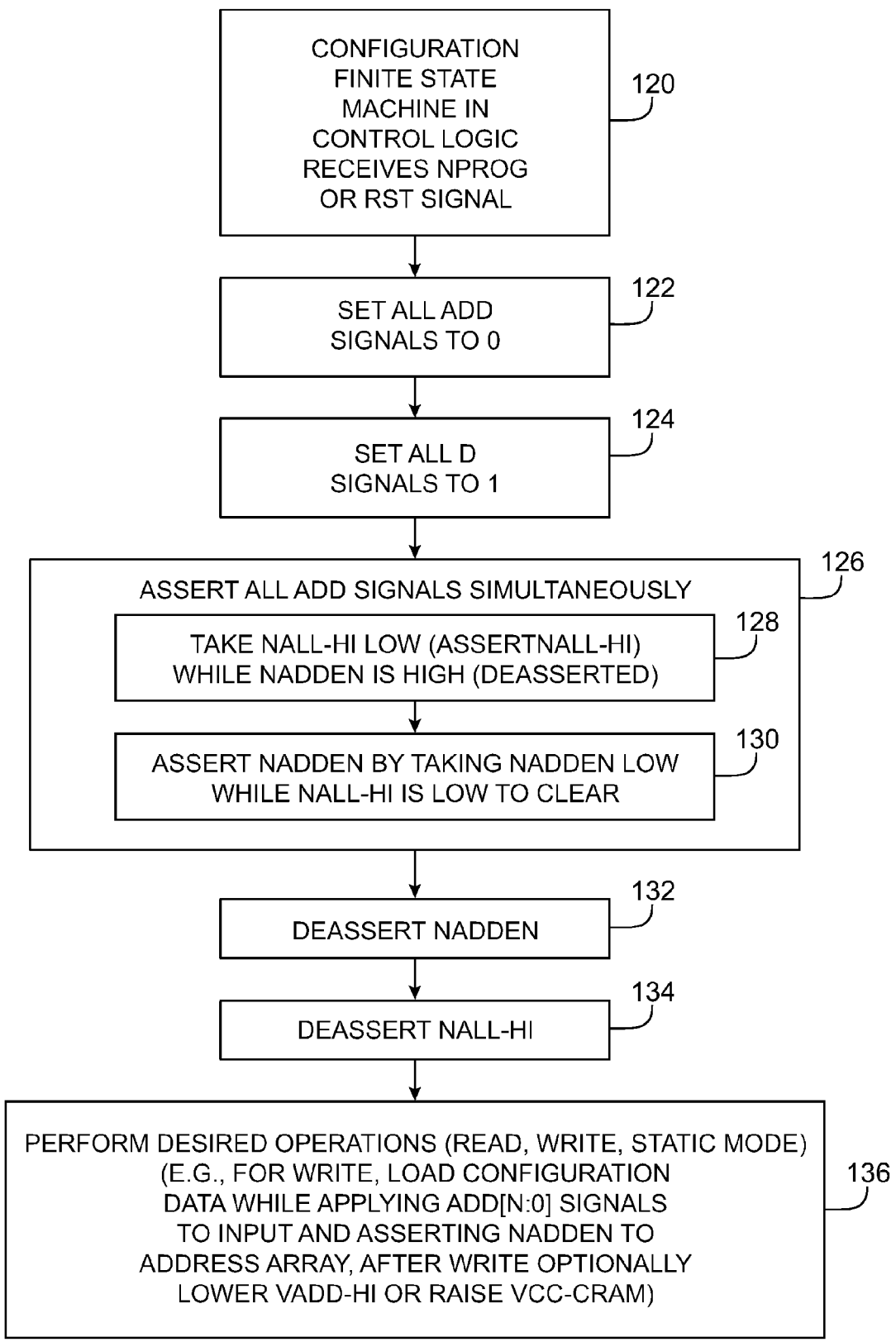
FIG. 13 is a flowchart of illustrative steps involved in operating an array of programmable memory elements in which multiple programmable elements are cleared simultaneously in accordance with an embodiment of the present invention.
Figure 14:
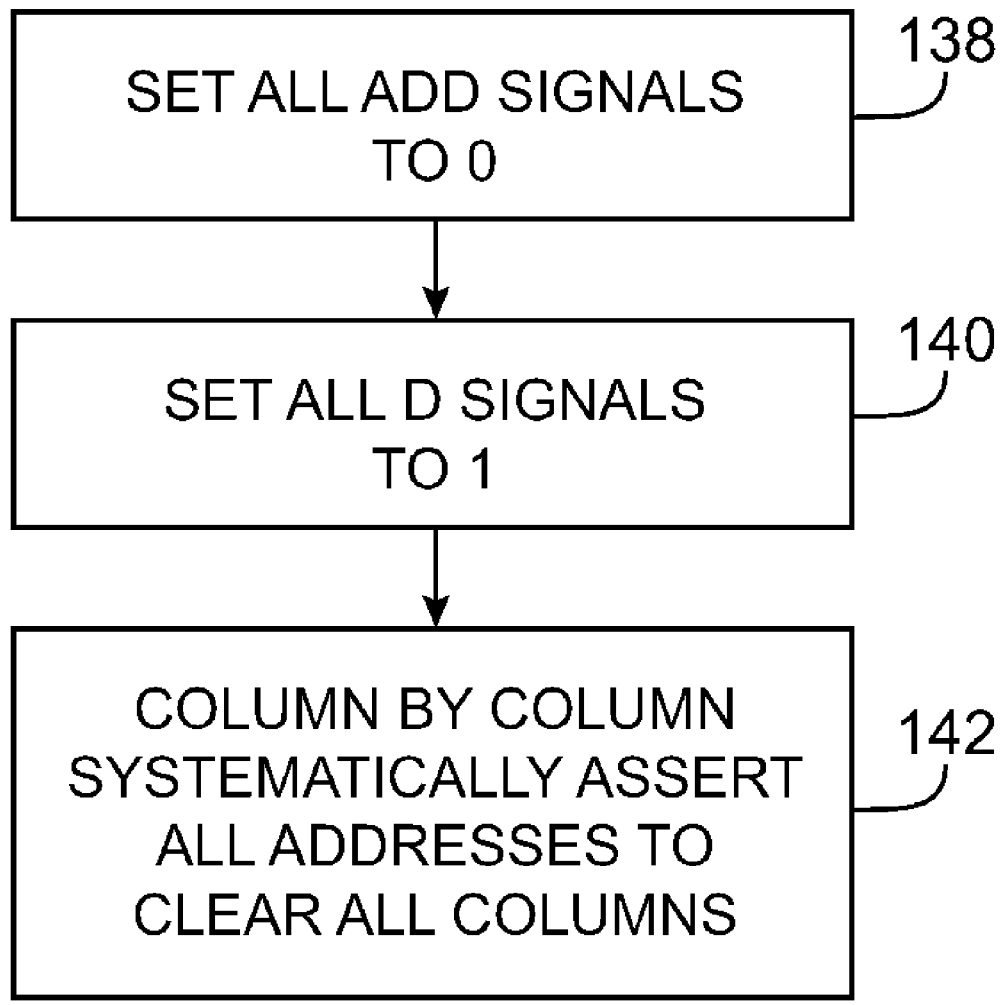
FIG. 14 is a flowchart of illustrative steps involved in operating an array of programmable memory elements in which programmable elements are cleared on a column-by-column basis in accordance with an embodiment of the present invention.

FIGS. 13 and 14 show illustrative steps involved in operating array 28 on device 10. The arrangement of FIG. 13 involves a simultaneous clear operation (by asserting the NALL-HI clear control signal). The arrangement of FIG. 14 involves systematically clearing array 28 on a column-by-column basis.

As shown in FIG. 13, configuration finite state machine 36 may receive a control signal such as the illustrative RST and NPROG signals of FIG. 12 at step 120, indicating that array 28 should be cleared.

At step 122, in response to the received control signal, configuration finite state machine 36 may take all address signals ADD to 0 (e.g., by deasserting NADDEN).

At step 124, configuration finite state machine 36 may then load all registers in data shift register 24B with logic ones. By loading data shift register full of logic ones, data lines 32 may all be taken high to clear array 28.

At step 126, while the data lines 32 are high, all ADD signals may be asserted simultaneously. In particular, as described in connection with address decoder circuitry 24A of FIG. 7, clear control signal NALL-HI may be asserted while address output enable signal NADDEN is deasserted (step 128), followed by asserting address output enable signal NADDEN while clear control signal NALL-HI is still asserted (step 130). This operation loads the high data line signals D on lines 32 into the complementary cell nodes NQ and thereby clears array 28.

At steps 132 and 134, address output enable signal NADDEN and clear control signal NALL-HI may be respectively deasserted. Additional memory array operations may be performed at step 136. For example, data loading operations may be performed, data read operations may be performed, and array 28 may be used in its normal operating mode in which output signals OUT are applied to programmable logic 18.

With the technique shown in FIG. 14, data loading operations are typically performed more slowly than with the technique of FIG. 13, because the NALL-HI signal is omitted. In this type of arrangement, NAND gates 74 in address decoder circuitry 24A may be replaced with logic gates such as inverters. Parallel clear operations are replaced with a column-by-column clearing operation.

Initially, at step 138, configuration finite state machine 36 may set all address signals ADD on address lines 34 low (e.g., by deasserting NADDEN).

At step 140, all data signals D in data shift register 24B may be loaded with logic ones, thereby taking all data lines 32 high.

During the operations of step 142, configuration finite state machine 36 may systematically assert all address lines 36 on a column-by-column basis. As the address signal in each column of array 28 is taken high, the D signals are driven into the data nodes NQ, thereby clearing all of the memory cells 20 in that column. Once the desired portion of array 28 has been cleared, additional operations may be performed (data read operations, data load operations, normal operation to configure logic 18, etc.), as described in connection with the operations of step 136 (FIG. 13).

The foregoing is merely illustrative of the principles of this invention and various modifications can be made by those skilled in the art without departing from the scope and spirit of the invention.

What is claimed is:

1. Circuitry, comprising:
   address decoder and data register circuitry responsive to control signals; and
   an array of memory elements, each memory element having only five transistors, wherein the five transistors in each memory element include an address transistor and four transistors configured to form a bistable memory element that is addressed by the address transistor, wherein the address decoder and data register circuitry is configured to clear the array of memory elements by loading a given data value into the memory elements, wherein the address decoder and data register circuitry includes an address decoder having a control input path operable to receive a clear control signal and has a plurality of address output lines that are coupled to the address transistors, wherein the address decoder comprises a decoder output stage operable to receive an address output enable signal, and wherein the address decoders supplies a first logic value to all of the plurality of address output lines when the address output enable signal is deasserted and supplies a second logic value different than the first logic value to all of the plurality of address output lines when the address output enable signal is asserted.

2. The circuitry defined in claim 1 wherein the address decoder comprises a decoder input stage that has a plurality of logic gates, wherein at least some of the logic gates have inputs operable to receive the clear control signal.

3. The circuitry defined in claim 1 wherein the address decoder is operable to receive undecoded address signals and is operable to output corresponding decoded address signals for the array of memory elements, wherein the address decoder comprises level shifting circuitry operable to boost the decoded address signals.

4. The circuitry defined in claim 3 wherein the address decoder comprises a decoder input stage that has a plurality of logic gates, wherein at least some of the logic gates have inputs operable to receive the clear control signal.

5. The circuitry defined in claim 4 wherein the logic gates comprise NAND gates.

6. The circuitry defined in claim 1 wherein the address decoder is operable to supply the second logic value to all of the plurality of address output lines when the address output enable signal is asserted while the clear control signal is being asserted, wherein the first logic value comprises a logic zero, and wherein the second logic value comprises a logic one.

7. An integrated circuit, comprising:
programmable logic including a plurality of transistors each having a gate; an array of memory cells that comprises a plurality of address lines and that stores data, each memory cell having only five transistors including one transistor that serves as an address transistor and four other transistors that form two cross-coupled inverters that serve as a bistable memory element addressed by the address transistor, wherein each memory cell has an output that conveys a static control signal to the gate of a respective one of the transistors in the programmable logic; and
an address decoder that includes logic gates, wherein at least some of the logic gates receive undecoded address signals and have inputs that receive a common clear control signal, wherein each of the plurality of address lines is associated with a respective address signal from the address decoder, wherein the address decoder comprises a plurality of address signal outputs that respectively supply the address signals to the plurality of address lines, and wherein the address decoder is configured to take all of the address signals on the plurality of address signal outputs to a first logic value when the clear control signal is asserted.

8. The integrated circuit defined in claim 7 wherein the first logic value comprises a logic high value, and wherein the address decoder is configured to take all of the address signals on the plurality of address signal outputs to the logic high value when the clear control signal is asserted.

9. The integrated circuit defined in claim 8 wherein the address decoder further comprises a decoder output stage operable to receive an address output enable signal, wherein the output stage is operable to provide all of the address signals at a second logic value that is different than the first logic value whenever the address output enable signal is deasserted.

10. The integrated circuit defined in claim 9 wherein the address decoder further comprises level shifting circuitry operable to boost the address signals before the address signals are provided on the address signal outputs.

11. The integrated circuit defined in claim 10 further comprising power supply circuitry operable to supply a first power supply voltage for the array of memory cells to power the bistable memory elements when loading data into the memory cells and operable to supply a second power supply voltage that is greater than the first power supply voltage for the array of memory cells during normal operation so that the static control signals for at least some of the memory cells are elevated with respect to the first power supply voltage.

12. A method for using an array of five-transistor memory cells that are addressed using address lines on a programmable integrated circuit that contains programmable logic transistors, comprising:
during normal operation, applying static output control signals from each of the memory cells to a gate of a respective one of the programmable logic transistors;
during memory array clearing operations, taking all of the address lines in the array of five-transistor memory cells to a common logic value using an address decoder responsive to a clear control signal;
with the address decoder, receiving the address output enable signal; and
with the address decoder, blocking all of the decoded address signals from reaching the address lines so that the address lines are all at a logic value complementary to the common logic value when the address output enable signal is deasserted and supplying the decoded address signals to the address lines when the address output enable signal is asserted.

13. The method defined in claim 12 further comprising:
with the address decoder, receiving undecoded address signals; and
during data loading operations, decoding the undecoded address signals and supplying corresponding decoded address signals to the address lines.

14. The method defined in claim 12 further comprising loading data shift register circuitry with data values that are all the same in preparation for array clearing operations.

15. The method defined in claim 14, wherein the integrated circuit comprises a programmable logic device, the method further comprising:
while the clear control signal is asserted, asserting the address output enable signal to direct the address decoder to take all of the address lines to the common logic value to clear the array of memory elements on the programmable logic device by driving data values that are the same into the memory elements; and
after the array of memory elements has been cleared, loading configuration data into the array of memory elements.

16. The method defined in claim 12 further comprising:
while the clear control signal is asserted, asserting the address output enable signal to direct the address decoder to take all of the address lines to the common logic value to clear the array of memory elements.

* * * * *